United States Patent
Anpo et al.

(10) Patent No.: US 6,787,199 B2
(45) Date of Patent: Sep. 7, 2004

(54) COMPOSITE DEVICE AND MANUFACTURING METHOD THEREFOR

(75) Inventors: Masakazu Anpo, Izumisano (JP); Masato Takeuchi, Sakai (JP); Satoru Dohshi, Sakai (JP); Norihiko Kuzuya, Shizuoka (JP)

(73) Assignee: Murakami Corporation, Shizuoka (JP)

( * ) Notice: Subject to any disclaimer, the term of this patent is extended or adjusted under 35 U.S.C. 154(b) by 0 days.

(21) Appl. No.: 10/414,104

(22) Filed: Apr. 16, 2003

(65) Prior Publication Data

US 2003/0198735 A1 Oct. 23, 2003

Related U.S. Application Data

(62) Division of application No. 10/181,982, filed as application No. PCT/JP01/09897 on Nov. 13, 2001.

(30) Foreign Application Priority Data

Nov. 24, 2000 (JP) ........................................ 2000-357326

(51) Int. Cl.[7] .............................................. C23C 14/48
(52) U.S. Cl. .................. 427/529; 427/562; 427/255.31; 427/255.38; 502/103; 502/202
(58) Field of Search ................................ 427/529, 562, 427/255.31, 255.38; 502/103, 202

(56) References Cited

U.S. PATENT DOCUMENTS 5,854,708 A     12/1998   Komatsu et al.
6,355,308 B1 *  3/2002    Sato et al. ................ 427/419.8

FOREIGN PATENT DOCUMENTS

EP     490543 A2 *    6/1992   ........... C01B/35/12
GB    2327428 A  *    1/1999   ........... C03C/17/34
WO    WO 9858736 A1 * 12/1998  ............ B01J/35/02

OTHER PUBLICATIONS

Moon et al., Catalysis Today, vol. 45, Issues 1–4, Oct. 19, 1998, pp. 79–84, abstract only.*
S–C. Moon et al.: "Potocatalytic production of hydrogen from water using $TIO_2$ and $B/TIO2$" Catalysis Today, vol. 58, No. 2–3, pp. 125–132.
Ken Harada et al.: "Cluster Ion beam–hou ni yoru sanka titanium hikari shokubai no chousel to sono ekusou hikari shokubai hannou kassel" Shokubai, vol. 40, No. 6, pp. 478–481.
C–W. Hsien et al.: "Multiple coating of titanium–boron oxide sol–gel on glass" Mater. Res.Bull., vol. 27, No. 6, pp. 715–722 1992.
J.A. Hafthorne et al.: "Sputtered tiania borosilicate glass film" Thin Solid Films, vol. 202, No. 2, pp. 321–331 1951.

* cited by examiner

Primary Examiner—Timothy Meeks
(74) Attorney, Agent, or Firm—Oblon, Spivak, McClelland, Maier & Neustadt, P.C.

(57) ABSTRACT

This invention provides a composite device whereby surface reflection and interference colors can be inhibited, photocatalytic decomposition performance may be improved and hydrophilicity-acquiring rate may be improved. A mixture film (14) is deposited on the surface of a base (12). The mixture film (14) is a colorless and transparent mixture film with a high light transmittance made of a mixture of boron oxide and photocatalytic titanium oxide.

7 Claims, 9 Drawing Sheets

14 12 36

14 40 12

14  40  12  44  36

14  12  48

COMPOSITE DEVICE AND MANUFACTURING METHOD THEREFOR

This application is a Division of application Ser. No. 10/181,982 filed on Jul. 24, 2002, which was originally filed as International Application PCT/JP01/09897, filed Nov. 13, 2001.

TECHNICAL FIELD

This invention relates to a composite device exhibiting, e.g., antifouling property and hydrophilicity and a manufacturing method therefor, and provides a composite device whereby surface reflection and interference colors can be minimized, photocatalytic decomposition performance can be improved and a hydrophilicity-acquiring rate can be improved.

BACKGROUND ART

There has been, for example, described a conventional composite device exhibiting antifouling property and hydrophilicity manufactured by depositing, on a base surface, a photocatalytic titanium oxide film, on which a porous inorganic oxide film (e.g., silica) is deposited (Japanese Patent Laid-Open No. 10-36144).

In the above conventional composite device, the photocatalytic titanium oxide has a high refractive index n (n=about 2.4), leading to high surface reflection on the device surface. Thus, when applied to, for example, an automobile rear view mirror, it may cause a double image. Furthermore, when the photocatalytic titanium oxide film is thick, it may cause interference colors.

This invention, therefore, is directed to provision of a composite device by which the problems in the above-mentioned prior art can be solved, i.e., surface reflection and interference colors can be minimized, photocatalytic decomposition performance can be improved and a hydrophilicity-acquiring rate can be improved.

DISCLOSURE OF INVENTION

A composite device of this invention comprises a mixture film, i.e., a film made of a mixture, containing boron oxide and a photocatalytic material as main components on a base surface. According to this invention, contaminants on the surface of the mixture film may be decomposed and removed by photocatalytic effect of the photocatalytic material. In addition, it may endow hydrophilicity. Boron oxide has a low refractive index n of about 1.46. Therefore, when it is combined with a photocatalytic material having a high refractive index such as titanium oxide ($TiO_2$), a mixture film comprising these as main components may have a lower refractive index, resulting in reduction in surface reflection. Even when the film is deposited on a transparent base such as a glass (n=about 1.5), a polycarbonate (n=about 1.59) and an acrylate resin (n=about 1.5), interference colors can be minimized. The mixture film may be, therefore, made as a film with less surface reflection such as a colorless and transparent film. Thus, when the base is a colorless and transparent substrate made of, for example, glass or synthetic resin, the mixture film may be deposited on one or both surfaces of the base to form a colorless and transparent composite device with a high transmittance; specifically, an antifouling or antifog window glass for a building or an automobile may be provided. Our experimental results have shown that adding boron oxide to a photocatalytic material tends to improve photocatalytic decomposition performance and a hydrophilicity-acquiring rate by irradiation of light such as ultraviolet rays, compared with a material without boron oxide.

In a composite device of this invention, a mixture film is not limited to one which substantially consists of boron oxide and a photocatalytic material only, but the mixture film may contain other materials. A boron-oxide content in the mixture film may be controlled to, for example, 50% to 95% both to provide adequate refractive-index reduction and adequate photocatalytic effect. In the mixture film, the photocatalytic material may exist in a particulate state in boron oxide. The photocatalytic material may be made of photocatalytic inorganic oxide such as titanium oxide.

In a composite device of this invention, a mixture film may be formed as the top surface of the device or another film may be formed on the mixture film. For example, a porous inorganic oxide film (e.g., a porous transparent inorganic oxide film such as a porous silica ($SiO_2$) film) may be directly or indirectly deposited on the surface of the mixture film to give, when the porous inorganic oxide film is the top surface of the composite device, hydrophilicity and hydrophilicity-retaining effects by the porous inorganic oxide film itself. Furthermore, if hydrophilicity is reduced due to adhesion of contaminants to the surface of the porous inorganic oxide film, photocatalytic effects of the photocatalytic material by irradiation of, e.g., ultraviolet rays may decompose the contaminants to recover hydrophilicity. When at least a part of openings reach the mixture film in the structure where the porous inorganic oxide film is the top layer of the composite device, photocatalytic effects by the photocatalytic material may easily reach the surface of the porous inorganic oxide film, resulting in acceleration in contaminant decomposition.

In a composite device of this invention, a base may be a transparent substrate such as a glass and a transparent synthetic-resin substrate and a reflective film may be deposited on the rear surface of the transparent substrate to form an antifouling or antifog mirror (a rear surface mirror: a mirror having a reflection surface on the rear surface of the base) as an exterior rear view mirror for an automobile, a bathroom mirror or a washstand mirror. In a composite device of this invention, an intermediate film may be formed between a base surface and a mixture film instead of depositing the mixture film directly on the base surface. When the base is made of a soda-lime glass, the intermediate film may be an alkali-diffusion inhibiting film which prevents alkali ions in the base from diffusing into the mixture film. Alternatively, in a composite device of this invention, a reflecting film may be deposited between a base surface and a mixture film as an intermediate film. The composite device may constitute an antifouling or antifog mirror (front surface mirror: a mirror having a reflection surface on the front surface of the base) as an exterior rear view mirror for an automobile, a bathroom mirror or a washstand mirror.

A composite device of this invention may be manufactured by a method comprising the steps of placing a crucible containing a raw material for a photocatalytic material and a crucible containing boron oxide under a vacuum atmosphere in which a small amount of oxygen is introduced; simultaneously evaporating the raw material for a photocatalytic material and boron oxide in these crucibles to allow clusters of the materials to be emitted from the nozzles of the crucibles, respectively; oxidizing the cluster of the emitted raw material for a photocatalytic material with oxygen to form a cluster of a photocatalytic material; ionizing the clusters of the photocatalytic material and of boron oxide; and accelerating the ionized clusters in an electric field to collide with a surface of a base to deposit a mixture film comprising the photocatalytic material and boron oxide as main components on the surface of the base. In the method, when the photocatalytic material is photocatalytic titanium oxide, for example, titanium metal may be used as a raw material for the photocatalyst.

BEST MODE FOR CARRYING OUT THE INVENTION

Embodiments of this invention will be described in tail.
(Embodiment 1)

Figure 1:
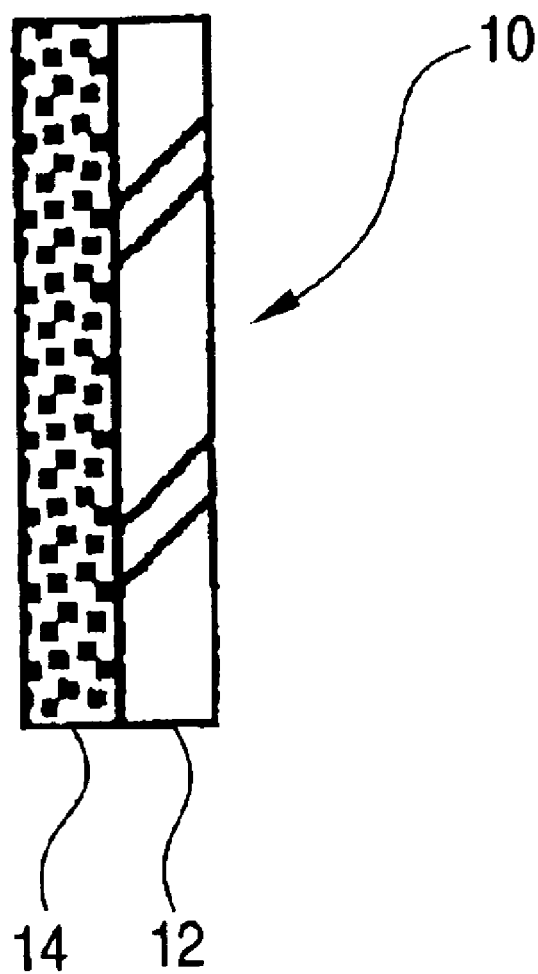
FIG. 1 is a cross section illustrating embodiment 1 of this invention.

FIG. 1 is a cross section showing a first embodiment of this invention. In FIG. 1, the thickness dimensions of a film are exaggerated in comparison with a real film, which is also applied to other embodiments. In a composite device 10, a base 12 is any of various substrates such as a glass substrate and a synthetic resin substrate. On the one surface of the base 12, a mixture film 14 is directly deposited to a thickness of, for example, about 0.1 to 1.0 µm. The mixture film 14 is a colorless and transparent film with a high light transmittance consisting of a mixture of boron oxide and photocatalytic titanium oxide, and the mixture film 14 forms the top surface of the composite device 10. In the composite device 10, the mixture film 14 is irradiated with ultraviolet rays to make the surface of the mixture film hydrophilic. Furthermore, if hydrophilicity is reduced due to adhesion of contaminants to the surface of the mixture film 14, photocatalytic effects of the photocatalytic material by irradiation of, e.g., ultraviolet rays may decompose the contaminants to recover hydrophilicity. When the base 12 is made of a transparent glass substrate or a transparent synthetic-resin substrate, the composite device 10 may be used as a window glass for a building or automobile. In such a use, the mixture film 14 in an indoor side may be effective in antifouling, dew condensation prevention and antifogging, while that in an outdoor side may be effective in antifouling and prevention of rain-drop adhesion.

Figure 2:
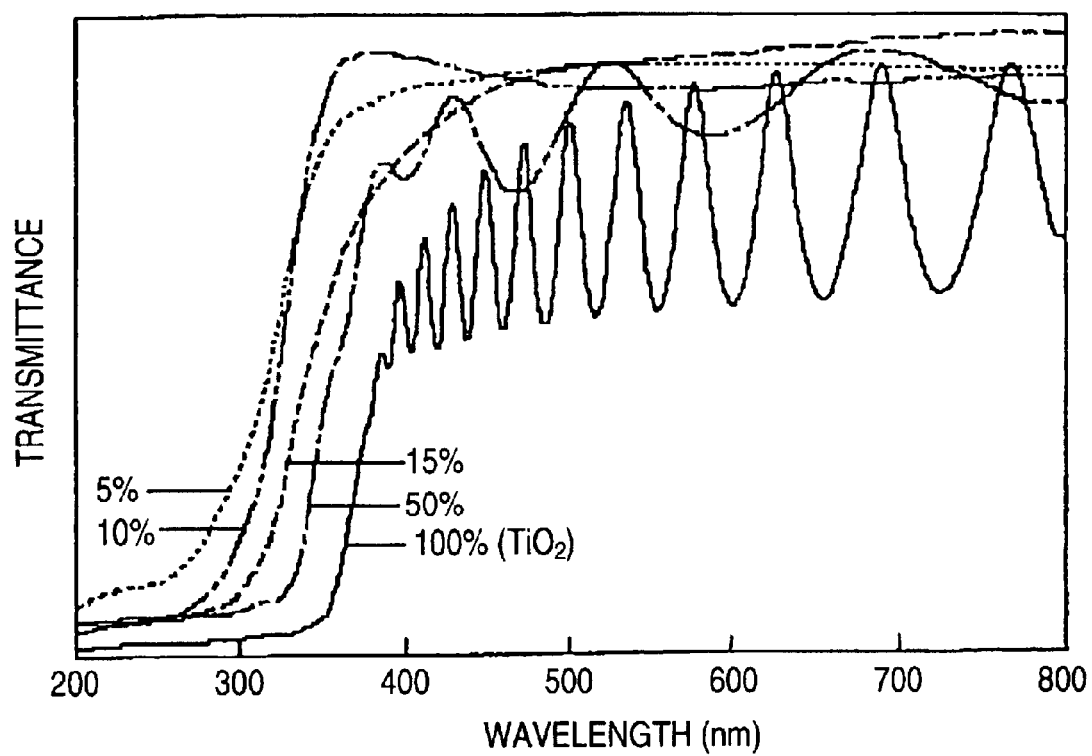
FIG. 2 shows spectral transmittance characteristics of a composite device 10 having the structure in FIG. 1.

FIG. 2 shows spectral transmittance properties of a composite device 10 having the structure in FIG. 1 where a substrate 12 is a colorless and transparent glass substrate and a mixture film 14 is formed on a surface of the substrate 12 to a thickness of 800 nm with varying mixing ratio (by weight) of photocatalytic titanium oxide and boron oxide. It may be seen from FIG. 2 that a composite device having the mixture film 14 consisting of photocatalytic titanium oxide and boron oxide exhibits a higher and flat transmittance compared with a composite device having a film consisting of only photocatalytic titanium oxide. Furthermore, the lower a content of photocatalytic titanium oxide is, the more significant such tendency is because a higher content of boron oxide may reduce a refractive index of the mixture film 14 so that surface reflection and interference colors can be inhibited.

Figure 3:
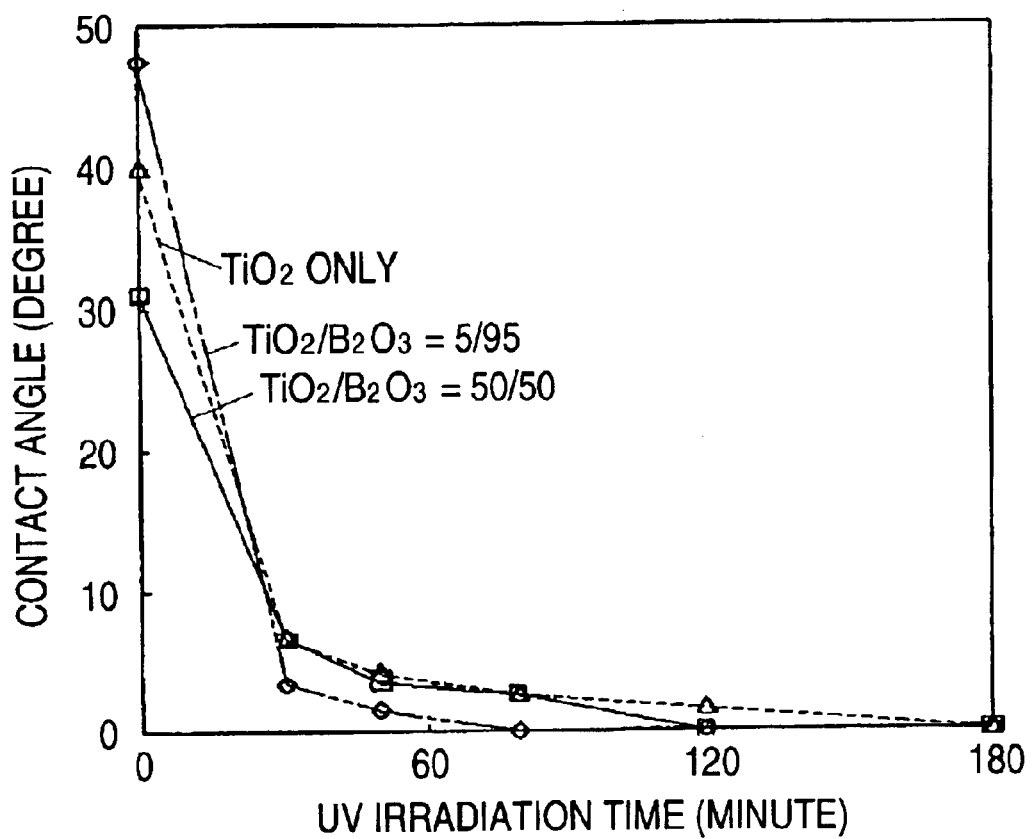
FIG. 3 shows variation of a contact angle of water after UV irradiation of a composite device 10 having the structure in FIG. 1.

FIG. 3 shows variation in a contact angle of water after UV irradiation measured about the composite device 10 having the structure in FIG. 1 when a mixture film 14 is deposited on a surface of the base 12 with different mixing ratio (by weight) of photocatalytic titanium oxide and boron oxide. It can be seen from FIG. 3 that coating by a mixture film 14 consisting of photocatalytic titanium oxide and boron oxide may reduce a contact angle after UV irradiation to about 0 degree. A mixing ratio of photocatalytic titanium oxide and boron oxide is suitably 50:50 (refractive index n=about 1.85) to 5:95 (refractive index n=about 1.6). The ratio of 50:50 may allow hydrophilicity-acquiring to proceed in a rate similar to that when the mixture film 14 consists of only photocatalytic titanium oxide (0:100). As a content of photocatalytic titanium oxide is reduced, hydrophilicity acquiring may be accelerated. Particularly, the ratio of 5:95 may lead to reduction in a time for decreasing a contact angle to about 0 degree to about a half of that required when coating is made of only photocatalytic titanium oxide (0:100).

Figure 4:
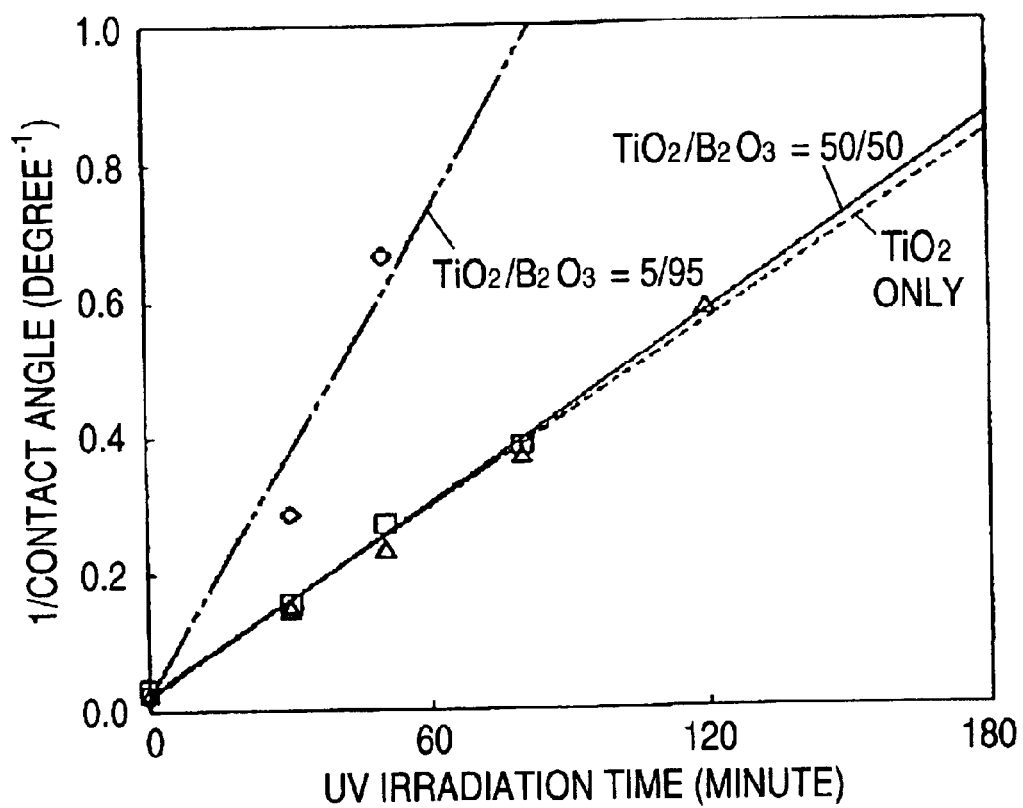
FIG. 4 shows linear approximation of the plots of an inverse of a contact angle vs time for measured data in FIG. 3.

FIG. 4 is a linear approximation of plots of an inverse of a contact angle vs time for the measured data in FIG. 3. A slope of the property corresponds to a rate of hydrophilicity acquiring. It can be seen from FIG. 4 that a mixing ratio of 5:95 for photocatalytic titanium oxide and boron oxide may result in hydrophilicity acquiring in an about two-fold rate in comparison with coating consisting of only photocatalytic titanium oxide (0:100). The phenomenon may be presumably caused because photocatalytic titanium oxide microparticles are highly dispersed in boron oxide by the reduction of a content of photocatalytic titanium oxide and the dioxide is highly activated by quantum size effect.

Figure 5:
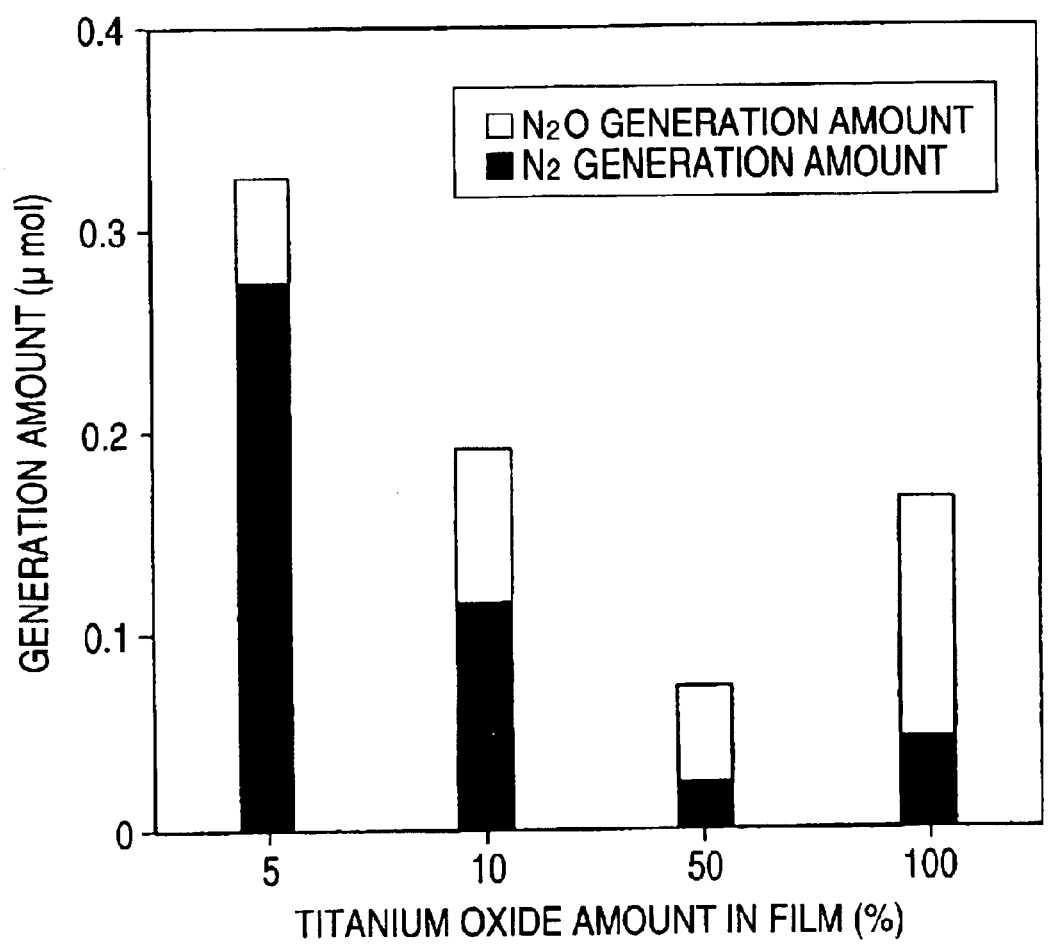
FIG. 5 shows difference in photocatalytic decomposition reaction depending on a content of a photocatalytic titanium oxide in the composite device 10 having the structure in FIG. 1.

FIG. 5 shows difference in photocatalytic decomposition reaction measured about the composite device 10 having the structure in FIG. 1 when a mixture film 14 is deposited on a base 12 with different mixing ratio of photocatalytic titanium oxide to boron oxide. Specifically, samples were prepared, with varying mixing ratio (by weight) of photocatalytic titanium oxide from 5%, 10%, 50% to 100%. Each sample was placed in a vessel, the vessel is evacuated while introducing a certain amount of NO, the sample is irradiated with ultraviolet rays for a given period, and the atmosphere gas in the vessel after irradiation was qualitatively and quantitatively analyzed by gas chromatography. By UV irradiation of the composite device 10, photocatalytic titanium oxide in the mixture film 14 is photoexcited to decompose NO by photocatalytic decomposition reaction, resulting in generation of $N_2O$ and $N_2$. It can be seen from FIG. 5 that as a content of photocatalytic titanium oxide is reduced, the amount of decomposed NO tends to be increased, i.e., increase in photocatalytic effect.

Figure 6:
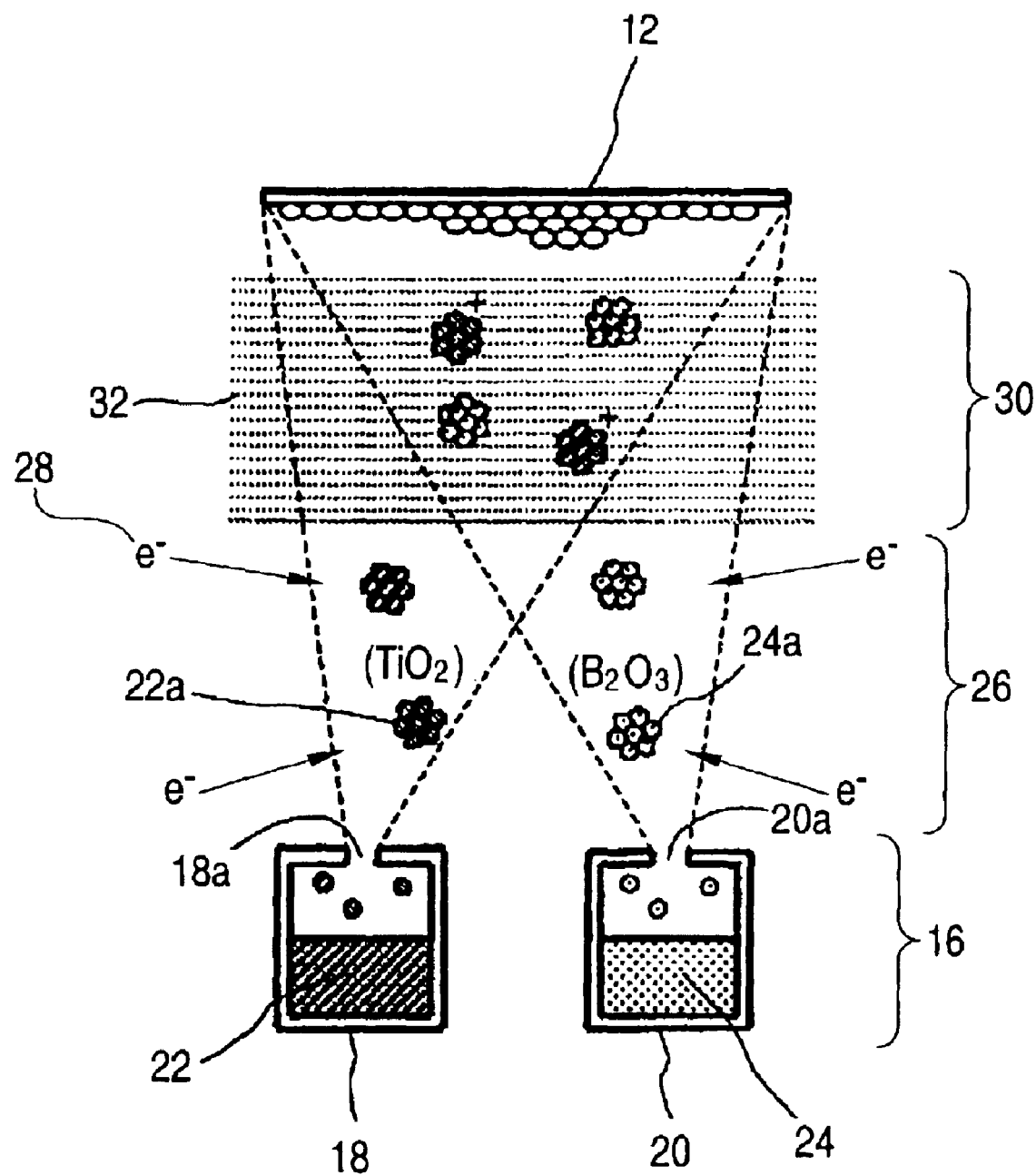
FIG. 6 schematically shows the inside configuration of an ionized cluster beam deposition apparatus with two ion sources used for depositing a mixture film 14 on the surface of the substrate 12 of the composite device 10 in FIG. 1.

There will be described a method for manufacturing the composite device 10 in FIG. 1. FIG. 6 schematically shows the inside configuration of a film-forming apparatus for depositing a mixture film 14 on a surface of a base 12. This apparatus is an ionized cluster beam deposition apparatus with two ion sources, where two deposition materials are simultaneously evaporated to deposit the mixture film 14. Oxygen is introduced into the deposition apparatus, which is kept under a vacuum atmosphere, for example, with a partial pressure of oxygen being $2 \times 10^{-4}$ Torr. In the lower part of the deposition apparatus, crucibles 18, 20 as a cluster generation zone 16 are placed in parallel. The crucibles 18, 20 contain metal titanium (Ti) 22 and boron oxide ($B_2O_3$) 24 as deposition materials, respectively. Above the crucibles 18, 20, a base 12 such as a quartz glass is placed, facing the crucibles. A temperature of the base 12 is kept at, for example, 673 K. In the cluster generation zone 16, the deposition materials 22, 24 in the crucibles 18, 20 are heated and evaporated by electron-beam bombardment, their vapors are emitted from nozzles 18a, 20a to generate clusters 22a, 24a (atomic/molecular aggregates). The metal titanium cluster is oxidized by the introduced oxygen immediately after emission from the nozzle 18a to form an titanium oxide ($TiO_2$) cluster 22a. These clusters 22a, 24a are ionized by electron shower 28 in an ionization zone 26. The ionized clusters 22a, 24a are accelerated by an electric field 32 in an acceleration zone 30 (an acceleration voltage is, for example, 500 V). On colliding with the base 12, the accelerated clusters 22a, 24a are broken into individual atoms and molecules, which are then deposited on the base 12. A mixture film 14 consisting of boron oxide and photocatalytic titanium oxide is thus deposited on the base 12. A mixing ratio of boron oxide and photocatalytic titanium oxide may be controlled by an evaporation rate ratio of these deposition materials in the crucibles 18, 20. Photocatalytic titanium oxide microparticles are highly dispersed in boron oxide when a content of boron oxide is high, resulting in improvement in photocatalytic effect and accelerated hydrophilicity-acquiring.

(Embodiment 2)

Figure 7:
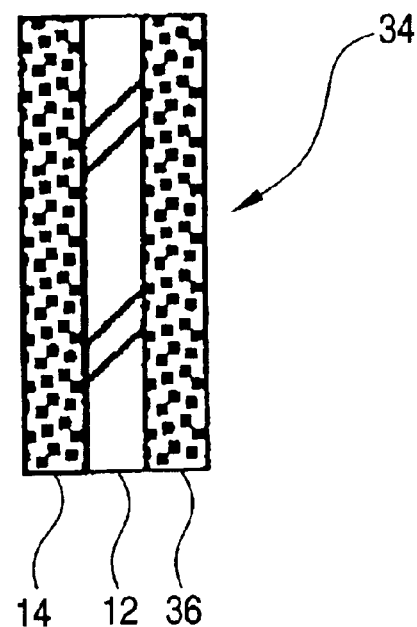
FIG. 7 is a cross section illustrating embodiment 2 of this invention.

FIG. 7 is a cross section illustrating a second embodiment of this invention. The same symbols are used for parts/members common to embodiment 1. In the composite device 34, a base 12 is a substrate made of an appropriate material such as a glass substrate and a synthetic-resin substrate. On both surfaces of the base 12, mixture films 14, 36 are directly deposited to, for example, a thickness of about 0.1 to 1.0 $\mu$m, respectively. The mixture films 14, 36 are colorless and transparent mixture films with a high light transmittance consisting of a mixture of boron oxide and photocatalytic titanium oxide. These mixture films 14, 36 constitute the top surfaces of the composite device 34. In the composite device 34, the mixture films 14, 36 are irradiated with ultraviolet rays so that the surfaces of the mixture films 14, 36 are made hydrophilic. Furthermore, if hydrophilicity is reduced due to adhesion of contaminants to the surfaces of the mixture films 14, 36, photocatalytic effects of photocatalytic titanium oxide by irradiation of, e.g., ultraviolet rays may decompose the contaminants to recover hydrophilicity. When the base 12 in the composite device 34 is made of a glass or transparent synthetic-resin substrate, it may be used as a window glass for building or automobile. In such a use, the film in an indoor side may be effective in antifouling, dew condensation prevention and antifogging, while that in an outdoor side may be effective in antifouling and prevention of rain-drop adhesion.

(Embodiment 3)

Figure 8:
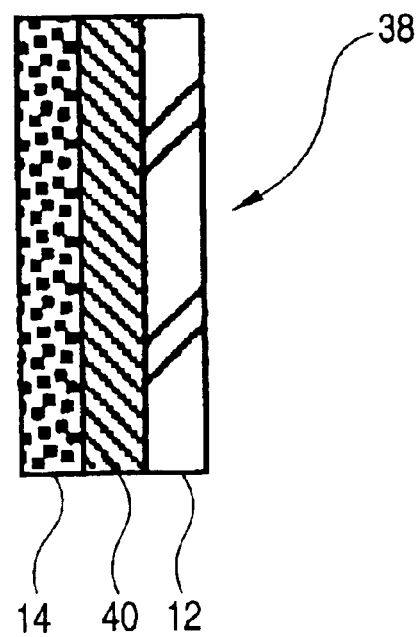
FIG. 8 is a cross section illustrating embodiment 3 of this invention.

FIG. 8 is a cross section illustrating a third embodiment of this invention. The same symbols are used for parts/members common to embodiments 1 and 2. In the composite device 38, a base 12 is a substrate made of an appropriate material such as a glass substrate and a synthetic-resin substrate. On one surface of the base 12 is deposited an intermediate film 40, on which is then deposited a mixture film 14 to, for example, a thickness of about 0.1 to 1.0 $\mu$m. The mixture film 14 is a colorless and transparent mixture film with a high light transmittance consisting of a mixture of boron oxide and photocatalytic titanium oxide. The mixture film 14 constitutes the top surface of the composite device 38. When the base 12 is made of a soda-lime glass, the intermediate film 40 may be an alkali-diffusion inhibiting film such as a silica film which prevents alkali ions in the base 12 from diffusing into the mixture film 14. When the intermediate film 40 is a metal film made of, for example, Al or Cr, the composite device 38 may constitute an antifouling or antifog mirror (front-surface mirror), in which the base 12 may be opaque; specifically, it may be used as an exterior rear view mirror for an automobile, a bathroom mirror or a washstand mirror. In the composite device 38, the mixture film 14 is irradiated with ultraviolet rays so that the surface of the mixture film 14 is made hydrophilic. Furthermore, if hydrophilicity is reduced due to adhesion of contaminants to the surface of the mixture film 14, photocatalytic effects of photocatalytic titanium oxide by irradiation of, e.g., ultraviolet rays may decompose the contaminants to recover hydrophilicity.

(Embodiment 4)

Figure 9:
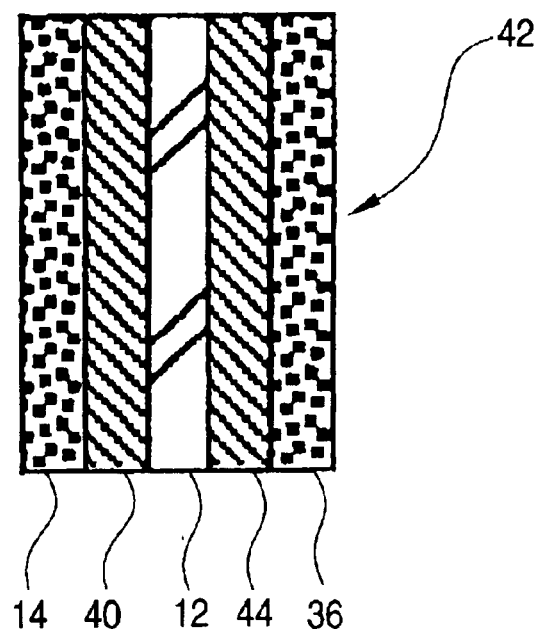
FIG. 9 is a cross section illustrating embodiment 4 of this invention.

FIG. 9 is a cross section illustrating a fourth embodiment of this invention. The same symbols are used for parts/members common to embodiments 1 to 3. In the composite device 42, a base 12 is a substrate made of an appropriate material such as a glass substrate and a synthetic-resin substrate. On both surfaces of the base 12 are deposited intermediate films 40, 44, on which are then deposited mixture films 14, 36 to, for example, a thickness of about 0.1 to 1.0 $\mu$m, respectively. The mixture films 14, 36 are colorless and transparent mixture films with a high light transmittance consisting of a mixture of boron oxide and photocatalytic titanium oxide. These mixture films 14, 36 constitute the outer surfaces of the composite device 42. In the composite device 42, the mixture films 14, 36 are irradiated with ultraviolet rays so that the surfaces of the mixture films 14, 36 are made hydrophilic. Furthermore, if hydrophilicity is reduced due to adhesion of contaminants to the surfaces of the mixture films 14, 36, photocatalytic effects of photocatalytic titanium oxide by irradiation of, e.g., ultraviolet rays may decompose the contaminants to recover hydrophilicity. When the base 12 in the composite device 42 is made of a glass or transparent synthetic-resin substrate, it may be used as a window glass for building or automobile. In such a use, the film in an indoor side may be effective in antifouling, dew condensation prevention and antifogging, while that in an outdoor side may be effective in antifouling and prevention of rain-drop adhesion.

(Embodiment 5)

Figure 10:
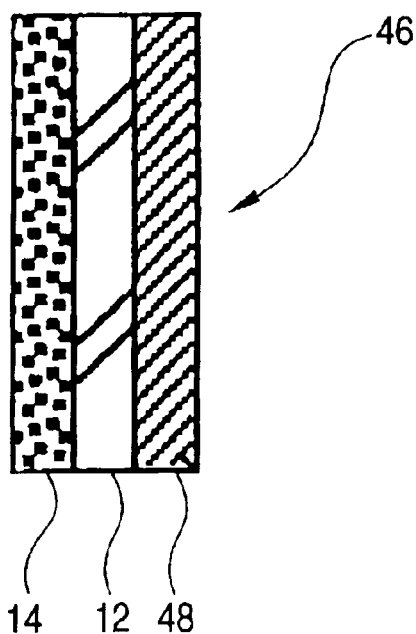
FIG. 10 is a cross section illustrating embodiment 5 of this invention.

FIG. 10 is a cross section illustrating a fifth embodiment of this invention. The same symbols are used for parts/members common to embodiments 1 to 4. In the composite device 46, a base 12 is a substrate made of an appropriate material such as a glass substrate and a synthetic-resin substrate. On one surface of the base 12 is directly deposited a mixture film 14 to, for example, a thickness of about 0.1 to 1.0 μm. The mixture film 14 is a colorless and transparent mixture film with a high light transmittance consisting of a mixture of boron oxide and photocatalytic titanium oxide. The mixture film 14 constitutes the top surface of the composite device 46. On the other surface (rear surface) of the base 12 is deposited a reflective film 48, i.e., a metal film made of a, for example, Al or Cr. The composite device 46 may constitute an antifouling or antifog mirror (rear-surface mirror); specifically, it may be used as an exterior rear view mirror for an automobile, a bathroom mirror or a washstand mirror. In the composite device 46, the mixture film 14 is irradiated with ultraviolet rays so that the surface of the mixture film 14 is made hydrophilic. Furthermore, if hydrophilicity is reduced due to adhesion of contaminants to the surface of the mixture film 14, photocatalytic effects of photocatalytic titanium oxide by irradiation of, e.g., ultraviolet rays may decompose the contaminants to recover hydrophilicity.

(Embodiment 6)

Figure 11:
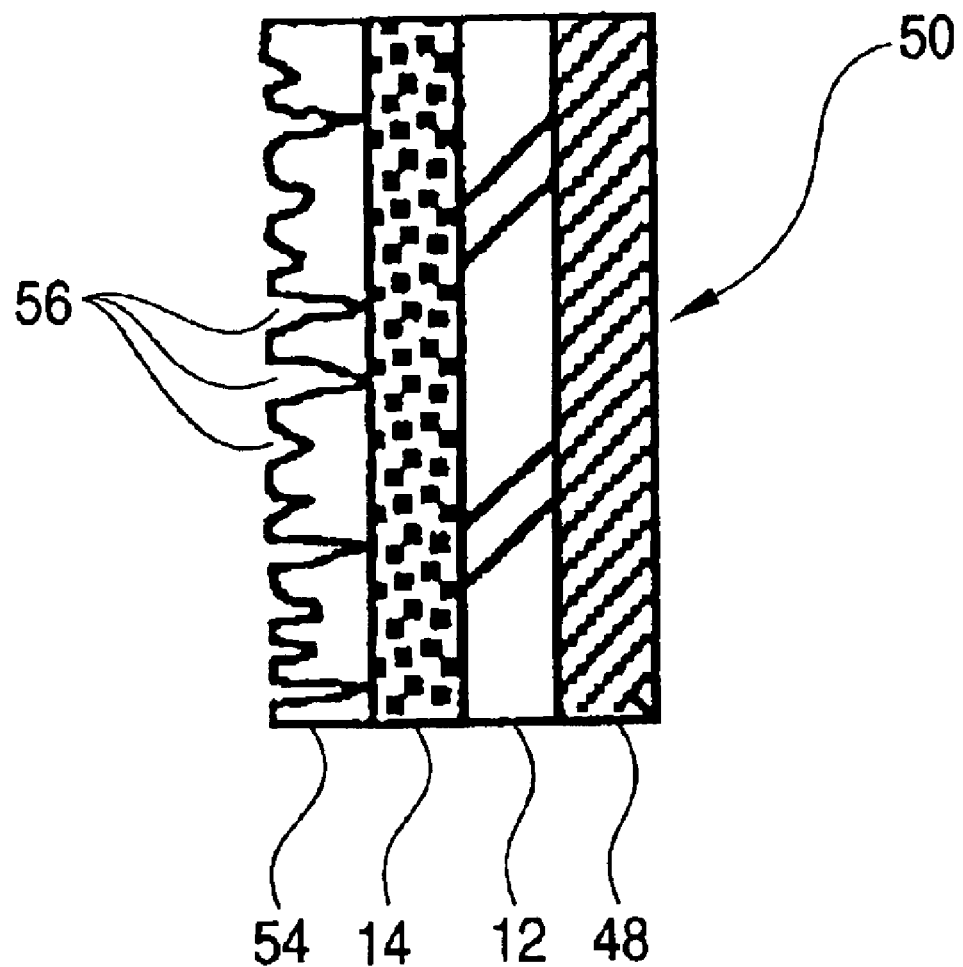
FIG. 11 is a cross section illustrating embodiment 6 of this invention.

FIG. 11 is a cross section illustrating a sixth embodiment of this invention. The same symbols are used for parts/members common to embodiments 1 to 5. In the composite device 50, a base 12 is a substrate made of an appropriate material such as a glass substrate and a synthetic-resin substrate. On one surface of the base 12 is deposited a mixture film 14 to, for example, a thickness of about 0.1 to 1.0 μm, which is a colorless and transparent mixture film with a high light transmittance consisting of a mixture of boron oxide and photocatalytic titanium oxide. On the surface of the mixture film 14 is deposited a porous transparent inorganic oxide film 54 such as a porous silica ($SiO_2$) film to a thickness of, for example, about 5 to 50 nm. The porous transparent inorganic oxide film 54 constitutes the top surface of the composite device 50. On the other surface (rear surface) of the base 12 is deposited a reflective film 48, i.e., a metal film made of, for example, Al or Cr. The composite device 50 may constitute an antifouling or antifog mirror (rear-surface mirror); specifically, it may be used as an exterior rear view mirror for an automobile, a bathroom mirror or a washstand mirror. In the composite device 50, thicknesses of the mixture film 14 and the porous transparent inorganic oxide film 54 may be appropriately controlled to provide a mirror without coloration due to interference colors. The porous transparent inorganic oxide film 54 itself may give and keep hydrophilicity. Furthermore, if hydrophilicity is reduced due to adhesion of contaminants to the surface of the porous transparent inorganic oxide film 54, photocatalytic titanium oxide in the mixture film 14 is photoexcited by UV irradiation of the mixture film 54 to decompose the contaminants by photocatalytic effect, resulting in recovery of hydrophilicity. When at least a part of openings 56 in the porous transparent inorganic oxide film 54 reach the mixture film 14, photocatalytic effects by photocatalytic titanium oxide may easily reach the surface of the porous transparent inorganic oxide film 54, resulting in acceleration in contaminant decomposition.

In the above embodiments, a mixture film consists of a photocatalytic material and boron oxide. Any material composition may be, however, used as long as the film comprises the photocatalytic material and boron oxide as main components. A photocatalytic material may be a photocatalytic oxide other than photocatalytic titanium oxide or another photocatalytic material. In embodiments 1 (FIG. 1), 2 (FIG. 7), 3 (FIG. 8) and 4 (FIG. 9), a porous transparent inorganic oxide film such as a porous silica ($SiO_2$) film as illustrated in FIG. 11 may be deposited on the surfaces of the mixture films 14, 36. In embodiments 5 (FIG. 10) and 6 (FIG. 11), an intermediate film as illustrated in FIG. 8 may be deposited between the substrate 12 and the mixture film 14. For example, when the base 12 is made of soda-lime glass, the intermediate layer may be an alkali-diffusion inhibiting film such as a silica film which prevents alkali ions in the base 12 from diffusing into the mixture film 14.

Industrial Applicability

As described above, this invention is useful as an exterior rear view mirror for an automobile, a bathroom mirror or a washstand mirror.

What is claimed is:

1. A method for manufacturing a composite device; wherein a mixture film comprising a photocatalytic material and boron oxide as main components is deposited on a surface of a base by:

placing a crucible containing a raw material for a photocatalytic material and a crucible containing boron oxide under a vacuum atmosphere in which a small amount of oxygen is introduced;

simultaneously evaporating the raw material for the photocatalytic material and boron oxide in these crucibles to allow clusters of the materials to be emitted from the nozzles of the crucibles, respectively;

oxidizing the cluster of the emitted raw material for the photocatalytic material with said introduced oxygen to form a cluster of the photocatalytic material;

ionizing the clusters of the photocatalytic material and of boron oxide; and accelerating the ionized clusters in an electric field to collide with the surface of the base, thereby forming a mixture film.

2. The method of claim 1, wherein the surface of the base comprises glass or a synthetic resin.

3. The method of claim 1, wherein an intermediate layer is formed on the surface of the base prior to forming the mixture film.

4. The method of claim 1, wherein the intermediate layer comprises a porous inorganic oxide film, an alkali-diffusion inhibiting film, or a reflecting film.

5. The method of claim 1, wherein the photocatalytic material comprises photocatalytic titanium oxide.

6. The method of claim 1, wherein said simultaneously evaporating is carried out so that the ratio of photocatalytic titanium oxide to boron oxide is 50:50 to 5:95.

7. The method of claim 1, wherein the raw material for a photocatalytic material is titanium.

* * * * *